US006610615B1

(12) United States Patent
McFadden et al.

(10) Patent No.: US 6,610,615 B1
(45) Date of Patent: Aug. 26, 2003

(54) PLASMA NITRIDATION FOR REDUCED LEAKAGE GATE DIELECTRIC LAYERS

(75) Inventors: Robert McFadden, Beaverton, OR (US); Jack Kavalieros, Portland, OR (US); Reza Arghavani, Aloha, OR (US); Doug Barlage, Portland, OR (US); Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/714,001

(22) Filed: Nov. 15, 2000

(51) Int. Cl.⁷ .................. H01L 21/31; H01L 21/469; H01L 21/336
(52) U.S. Cl. ............... 438/776; 438/197; 438/777
(58) Field of Search ................. 438/769, 776, 438/777, 792, 197

(56) References Cited

U.S. PATENT DOCUMENTS 5,685,949 A * 11/1997 Yashima et al. .......... 156/643.1

OTHER PUBLICATIONS

Hattagandy et al , American Institute of Physics, 1995, pp. 3495–3497.*
S.V. Hattangady, R. Kraft, D.T. Grider, M.A. Douglas, G.A. Brown, P.A. Tiner, J.W. Kuehne, P.E. Nicollian, & M.F. Pas, Ultrathin Nitrogen–Profile Engineered Gate Dielectric Films, IEDM, 1996, pp. 19.1.1–19.1.4, Dallas, TX.
S.V. Hattangady, H. Niimi, & G. Lucovsky, Controlled Nitrogen Incorporation At The Gate Oxide Surface, Appl. Phys. Lett., Jun. 19, 1995, pp. 3495–3497, American Institute of Physics, USA.
Dixit Kapila, Sunil Hattangady, Monte Douglas, Robert Kraft, & Michael Gribelyuk, Modeling and Optimization of Oxynitride Gate Dielectrics—Formation by Remote Plasma Nitridation of Silicon Dioxide, Journal of the Electrochemical–Society, 1999, pp. 1111–1116, vol. 146, The Electochemical Society, Inc., USA.
R. Kraft, T.P. Schneider, W.W. Dostalik, & S. Hattangady, Surface Nitridation of Silicon Dioxide with A High Density Nitrogen Plasma, J. Vac. Sci. Technol., Jul./Aug. 1997, pp. 967–970, American Vacuum Society, USA.
H. Niimi, K. Koh, & G. Lucovsky, Controlled Incorporation of Nitrogen At The Top Surface of Silicon Oxide Gate Dielectrics, MRS, Fall 1996, pp. 1–6, USA.
Yider Wu & Gerald Lucovsky, Ultrathin Nitride/Oxide (N/O) Gate Dielectrics for p+ –Polysilicon Gated PMOS-FET's Prepared by a Combined Remote Plasma Enhanced CVD/ Thermal Oxidation Process, IEEE Electron Device Letters, Oct. 1998, pp. 367–369, vol. 19 No. 10, USA.

* cited by examiner

Primary Examiner—Alexander Ghyka
(74) Attorney, Agent, or Firm—Blakely, Sokoloff, Taylor & Zafman LLP

(57) ABSTRACT

A method of forming a dielectric layer suitable for use as the gate dielectric layer in a MOSFET includes nitridizing a thin silicon oxide film in a low power, direct plasma formed from nitrogen. A gas having a lower ionization energy than nitrogen, such as for example, helium, may be used in combination with nitrogen to produce a lower power plasma resulting in a steeper concentration curve for nitrogen in the silicon oxide film.

23 Claims, 5 Drawing Sheets

PLASMA NITRIDATION FOR REDUCED LEAKAGE GATE DIELECTRIC LAYERS

BACKGROUND OF THE INVENTION

1. Field of the Invention

The present invention relates generally to semiconductor structures and manufacturing. More particularly, the invention relates to extremely thin dielectric layers and the formation thereof.

2. Background

Advances in semiconductor manufacturing technology have led to the integration of millions of circuit elements, such as transistors, on a single integrated circuit (IC). In order to integrate increasing numbers of circuit elements onto an integrated circuit it has been necessary to reduce the line widths of the various parts that make up an integrated circuit. Not only have interconnect line widths become smaller, but so have the dimensions of metaloxide-semiconductor field effect transistors (MOSFETs).

MOSFETs are also sometimes referred to as insulated gate field effect transistors (IGFETs). Most commonly, these devices are referred to simply as FETs, and are so referred to herein.

Transistor scaling typically involves more than just the linear reduction of the FET width and length. For example, both source/drain (S/D) junction depth and gate dielectric thickness are also typically reduced in order to produce a FET with the desired electrical characteristics.

Over the years, a substantial amount of research and development in the field semiconductor manufacturing has been dedicated to providing reduced thickness dielectric layers, as mentioned above. However, to be suitable for use as a FET gate dielectric layer, these reduced thickness dielectric layers are typically required to have certain characteristics. Among the characteristics that are desirable for a FET gate dielectric are a dielectric constant that is greater than that of silicon dioxide, and an ability to reduce dopant outdiffusion from an overlying doped polysilicon gate electrode into or through the gate dielectric layer.

What is needed is a thin dielectric layer suitable for use as the gate dielectric layer in a FET, and what is further needed are repeatable methods of making such thin gate dielectric layers.

DETAILED DESCRIPTION

A method of forming a dielectric layer suitable for use as the gate dielectric layer in a MOSFET includes nitridizing a thin silicon oxide film in a direct plasma formed from nitrogen. A second gas having a lower ionization energy than nitrogen, such as for example, helium, may be used in combination with nitrogen to produce a lower power plasma resulting in a steeper concentration curve for nitrogen in the silicon oxide film. This concentration curve may also be referred to as the nitrogen profile.

Alternatively, any suitable second gas may be used as long as it produces the result of a high concentration of nitrogen at the top surface of the oxide layer and lower concentrations further from the surface and little or no interfacial accumulation of nitrogen is observed at the gate oxide-silicon substrate interface. In other words, the second gas is characterized by its ability to reduce or inhibit the deep placement of nitrogen in the oxide or substrate regions.

Terminology

The terms, chip, integrated circuit, monolithic device, semiconductor device, and microelectronic device, are often used interchangeably in this field. The present invention is applicable to all the above as they are generally understood in the field.

Historically, the material most commonly used in the semiconductor industry to form the gate insulator layer of a FET is silicon dioxide. Thus, the gate insulator layer is frequently referred to simply as the gate oxide. The expression gate dielectric is also used to describe the gate insulator layer.

In accordance with the present invention, a nitrogen plasma is used to create a controlled nitrogen concentration profile in the gate oxide of a FET. A parallel plate plasma reactor is used to achieve this desired nitrogen concentration profile by direct ionic bombardment, as opposed to the use of a thermal nitridation operation, or a remote plasma reactor process which isolates the wafer from direct ionic bombardment.

Figure 1:
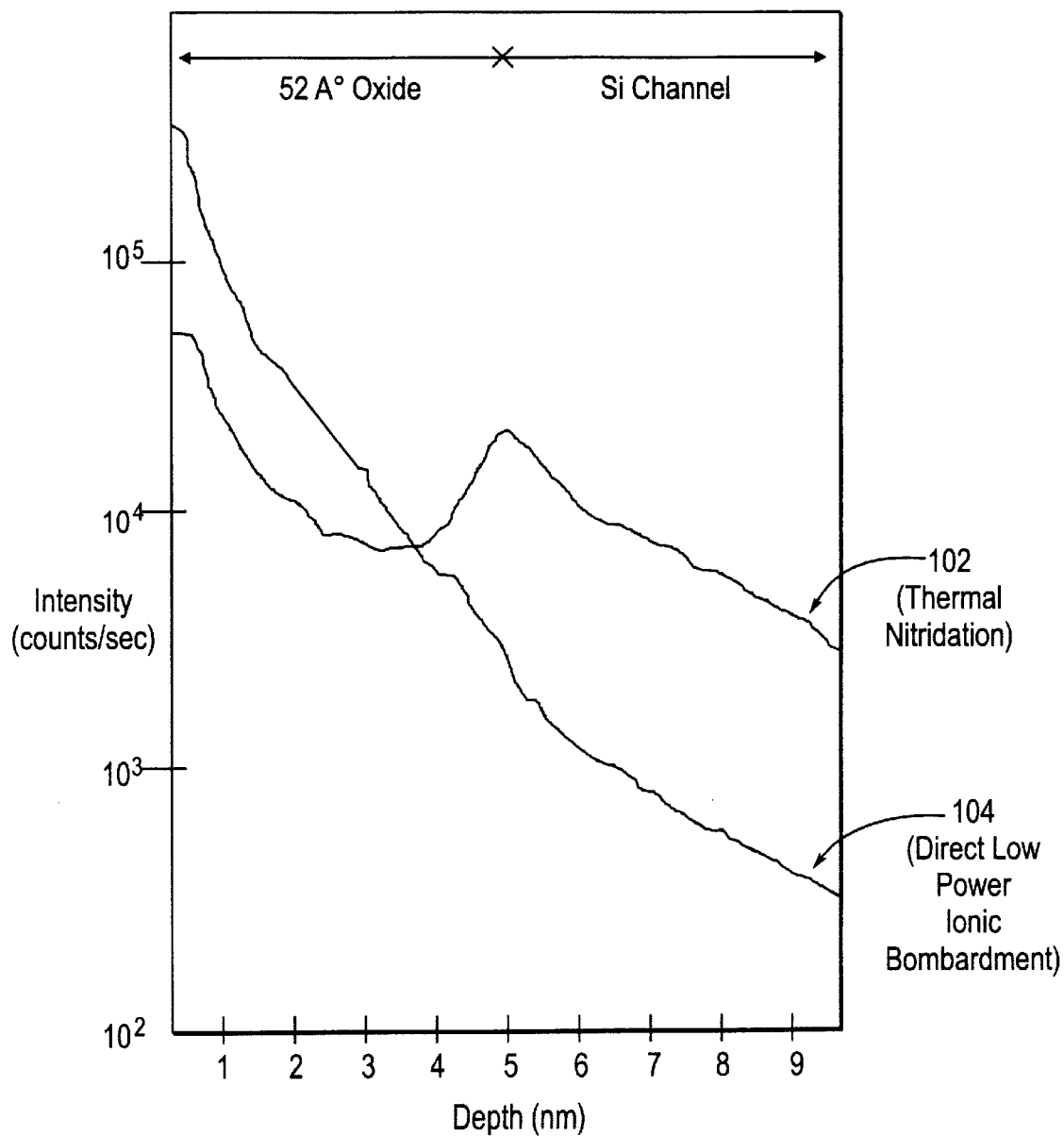
FIG. 1 is a graph showing nitrogen concentration profiles, based on secondary ion mass spectroscopy data, for a conventional thermal nitridation operation, and for a nitridation by direct ionic bombardment in accordance with the present invention.

Referring to FIG. 1, nitrogen profiles in a silicon oxide film about 52 angstroms in thickness, are shown for both thermal and direct plasma nitridation processes. The nitrided oxide films are disposed on a crystalline silicon substrate. FIG. 1 further shows the nitrogen profiles in the crystalline silicon beneath the oxide film. The nitrogen profile data 102 for the thermally nitrided oxide shows a first concentration of nitrogen at a top surface of an oxide layer, a generally declining concentration of nitrogen deeper in the oxide, an interfacial accumulation of nitrogen at the oxide-silicon interface, and finally, a nitrogen concentration gradient that is generally declining with distance into the substrate. In contradistinction it can be seen that the low energy, direct plasma nitridation process of the present invention produces a nitrogen profile 104 that is essentially monotonically decreasing from the top surface of the oxide layer through the oxide-silicon interface and into the substrate. That is, the undesirable interfacial accumulation of nitrogen seen with a thermal nitridation process does not occur with the low energy, ionic bombardment of the present invention. Furthermore, as can be seen in FIG. 1, the nitrogen concentration in the substrate is lower, at all depths, than is achieved with the thermal nitridation process. Although phrases such as monotonically decreasing, and continuously decreasing, are used herein to describe the nitrogen profiles achieved by processes in accordance with the present invention, it will be understood by those skilled in this field that this refers to the clear trend of the data, and not to specific data points.

Increasing the net nitrogen content in the gate oxide to increase the dielectric constant is desirable for several reasons. For example, such an increased nitrogen content may reduce leakage current due to tunneling during the operation of a FET, and may also reduce damage induced by Fowler-Nordheim tunneling currents during subsequent processing operations. Another benefit of increasing the net nitrogen content of the gate oxide is that the nitridized gate dielectric is more resistant to the problem of gate etch undercut, which in turn reduces defect states and current leakage at the gate edge.

A benefit of increasing nitrogen concentration at the gate electrode-gate oxide interface is that dopant outdiffusion from polysilicon gate electrodes into or through the gate oxide is reduced. This improves device reliability by reducing defect states in the bulk of the gate oxide caused by, for example, in-diffused boron from a boron doped polysilicon gate electrode.

A benefit of reducing nitrogen content at the gate oxide-silicon channel interface is the reduction of fixed charge and interface state density. This improves channel mobility and transconductance.

The Process

A parallel plate chemical vapor deposition (CVD) plasma reactor is used to treat, i.e., nitridize, a gate oxide layer. In a typical embodiment of the present invention, a cold-wall reactor is used, but this is not a requirement of the invention. A reactor suitable for use with the present invention employs a susceptor to support the wafer. The susceptor serves as an RF ground path and is heated to a processing temperature between 250° C. and 500° C. Above the wafer is the cathode to which 0.003 to 0.2 W/cm$^2$ of RF power is delivered at approximately 13.54 MHz. The cathode is in the form of a perforated plate through which process gasses can be delivered. In a typical embodiment of the present invention using a 200 mm reactor, $N_2$ is delivered, i.e., flowed, at 1 to 5 liters/minute, and He is flowed at 0 to 5 liters/minute. The cathode to susceptor spacing is kept between 0.4 to 1.6 cm. The reaction pressure is kept to between 0.5 and 4 torr by operation of a vacuum pump and throttle valve. The overall nitrogen content and profile achieved in the gate oxide can be controlled by modulating the temperature, RF power, gas flow and mixture, susceptor-to-cathode spacing, pressure and overall process time. For example, using a lower power setting and a longer process time provides a nitrogen concentration gradient with a desirably steeper slope. Similarly, maintaining the pressure at the lower end of the process range produces better doping profile results.

An illustrative process in accordance with the present invention generally begins with the growth of a thin thermal gate oxide using conventional methods, then exposing the gate oxide the nitridizing plasma process described above. Optionally, a rapid thermal anneal of the nitridized gate oxide in a $N_2$ atmosphere may be performed to reduce any existing defects, whether induced by the plasma or otherwise.

FET Structure

Referring back to FIG. 1, a comparison of the nitrogen concentration profiles of a gate oxide prepared by a conventional thermal nitridation process and that of a gate oxide prepared by a process in accordance with the present invention are shown. FIG. 1 shows secondary ion mass spectrometry (SIMS) data for the two gate oxides. From FIG. 1 it can be seen that the conventional thermal nitridation treatment gives a profile which has a lower nitrogen concentration at the top surface (i.e., gate electrode-gate oxide interface) and also has a notable build-up of nitrogen at the oxide-channel interface (alternatively referred to as the gate oxide-substrate interface). Still referring to FIG. 1, it can be seen that the inventive direct plasma nitridation treatment produces a similar net concentration of nitrogen, but provides a higher concentration at the top surface and a lower concentration at the oxide-channel interface.

Figure 2:
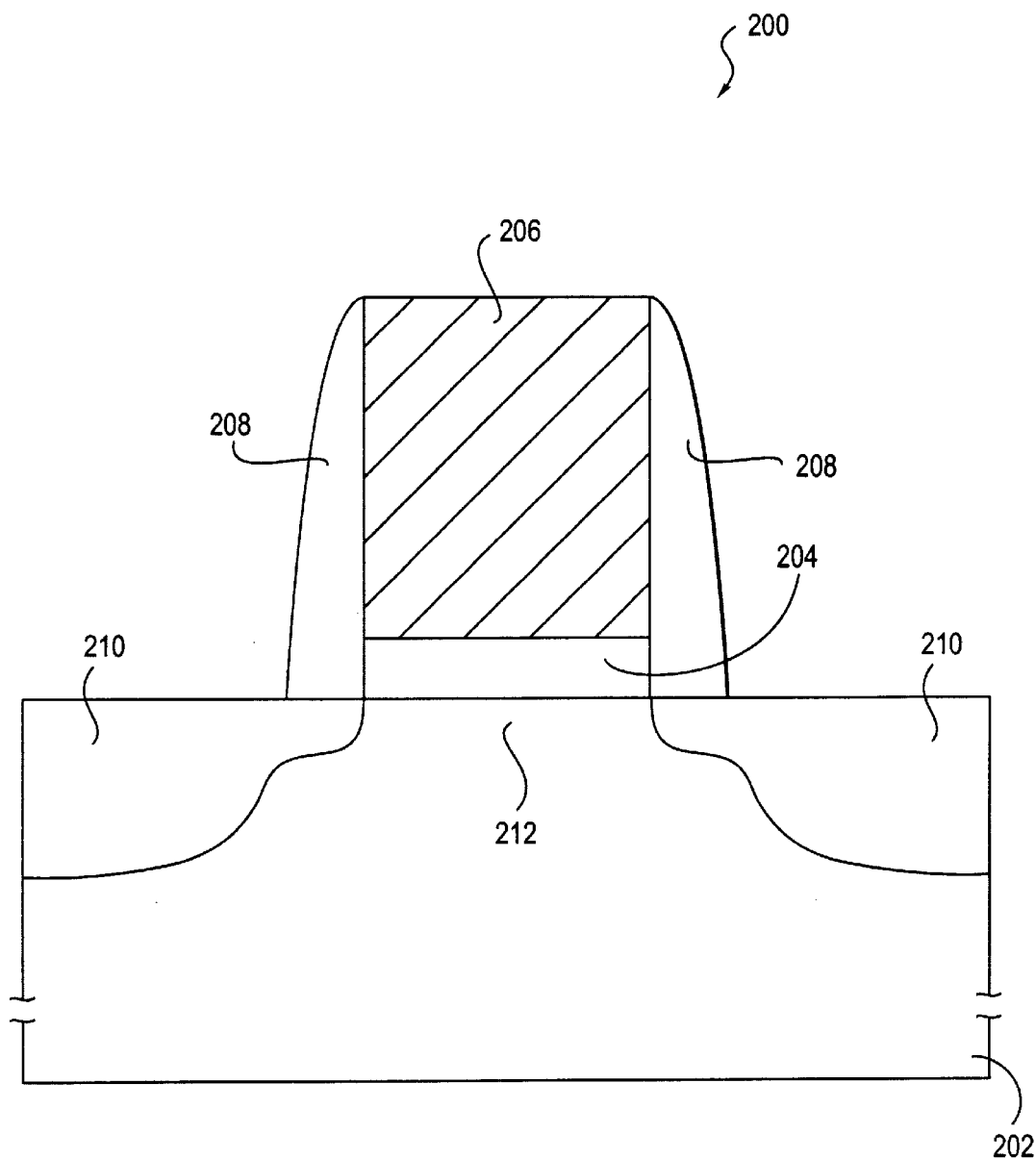
FIG. 2 is a schematic cross-sectional view of FET in accordance with the present invention.

FIG. 2 shows a cross section of FET 200 incorporating a gate oxide layer 204 prepared in accordance with the method of the present invention. The FET therefore has a nitrogen concentration profile in its gate oxide and channel regions not available in conventional FETs. That is the gate oxide layer, 10 angstroms or less in this example, has a high nitrogen concentration at the gate electrode-gate oxide interface, and the nitrogen concentration steadily decreases with distance from the gate electrode-gate oxide interface and there is no interfacial accumulation of nitrogen at the gate oxide-substrate interface. More particularly, FIG. 2 shows a substrate 202 on which a nitridized gate oxide 204 is disposed a gate electrode 206 overlies gate oxide 204. Sidewall spacers 208 are shown adjacent to the vertical sidewalls of gate oxide 204 and gate electrode 206. Source/drain junctions 210 are formed in substrate 202 substantially adjacent the opposing vertical sidewalls of gate electrode 206.

Figure 3:
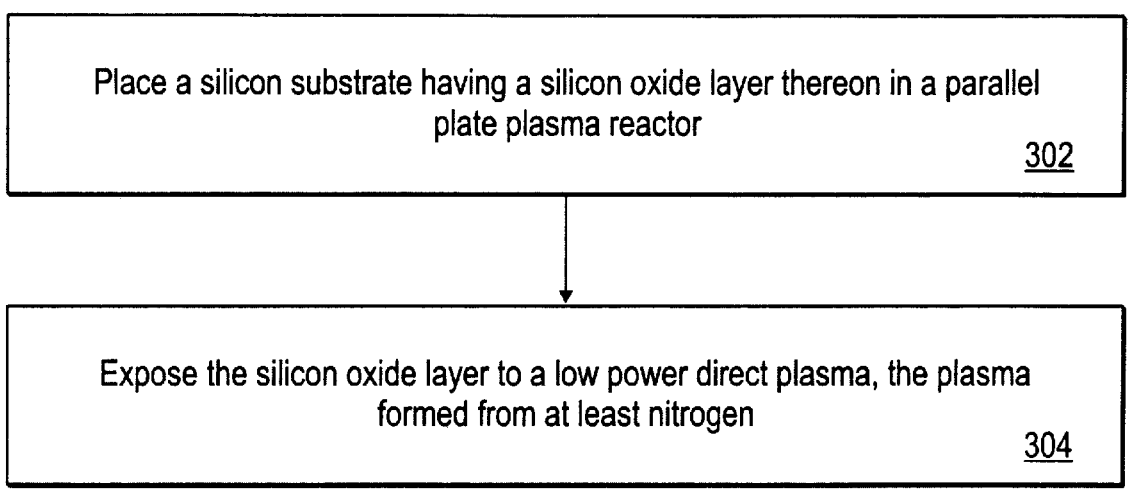
FIG. 3 is a flow diagram of a process in accordance with the present invention.

Referring now to FIG. 3, a flow diagram of a process in accordance with the present invention is shown. A process of making a dielectric layer in accordance with the present invention includes, as shown at block 302, placing a silicon substrate having a silicon oxide layer thereon in a parallel plate plasma reactor. As shown at block 304, the silicon oxide layer is then exposed to a low power, direct plasma formed from at least nitrogen.

Figure 4:
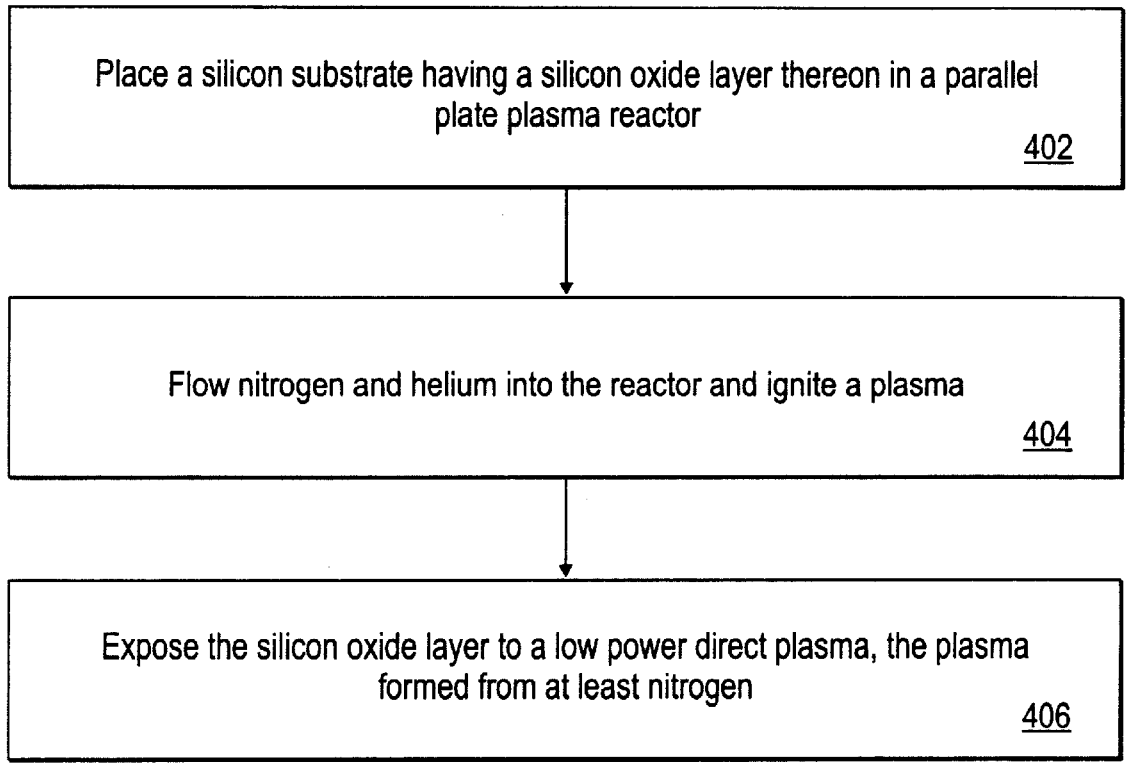
FIG. 4 is a flow diagram of a process in accordance with the present invention.

Referring now FIG. 4, a flow diagram of a process in accordance with the present invention is shown. In the embodiment of FIG. 4, a silicon substrate having a silicon oxide layer thereon is placed (402) in a parallel plate plasma reactor. The silicon oxide layer may be 10 angstroms or less in thickness. The plasma reactor may be of the cold-wall variety. The separation of the susceptor and cathode may be between 0.4 and 1.6 cm. Nitrogen and helium are flowed into the reactor (404) and a plasma is ignited. The silicon oxide layer is exposed (406) to the low power direct plasma thereby producing an essentially continuously decreasing nitrogen concentration from the top surface of the oxide to the bottom surface of the oxide, without an interfacial accumulation of nitrogen at the oxide-substrate interface.

Figure 5:
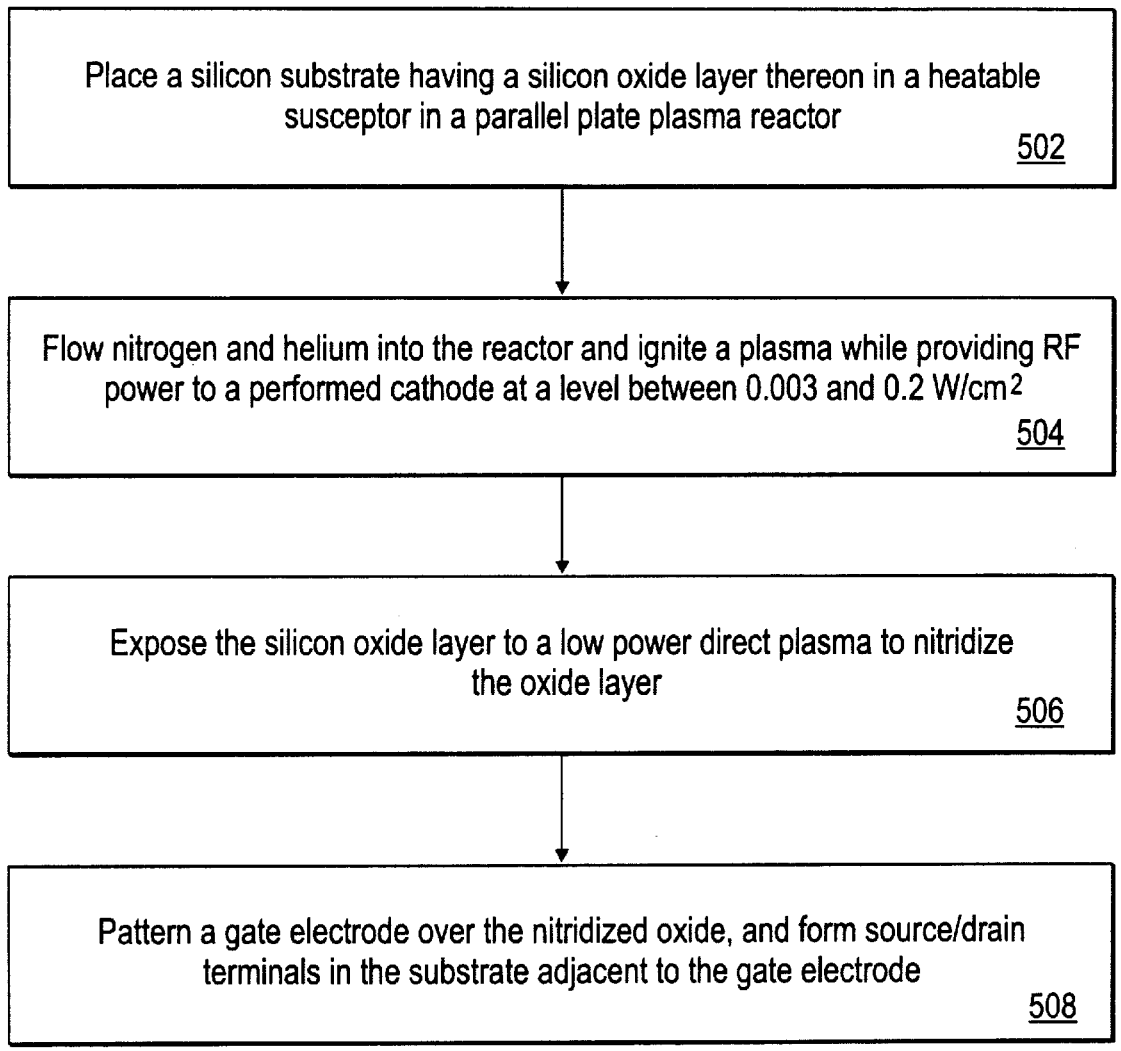
FIG. 5 is a flow diagram of a process in accordance with the present invention.

Referring now to FIG. 5, a flow diagram of a process for forming a FET in accordance with the present invention is shown. In the embodiment of FIG. 5, a silicon substrate having a silicon oxide layer thereon is placed (502) on a heatable susceptor in a parallel plate plasma reactor. Nitrogen and helium are flowed (504) into the reactor and a plasma is ignited while providing RF power to a perforated cathode at a level between 0.003 and 0.2 W/cm$^2$. The silicon oxide film is exposed (506) to the low power direct plasma to nitridize the oxide layer. This nitridation produces a steep nitrogen profile in the oxide layer with little or no nitrogen accumulation at the oxide-substrate interface. A gate electrode is then patterned over the nitridized oxide, and source/drain terminals are formed in the substrate adjacent to the gate electrode (508).

Various other layers of insulators and conducting material are formed above the gate level, as is well understood in the field of semiconductor manufacturing and integrated circuit design.

Conclusion

Embodiments of the present invention provide nitridized gate dielectric layers. Direct ionic bombardment by a nitrogen-containing, low energy plasma is used to obtain increased net nitrogen concentrations in the gate dielectric as compared to conventional thermal nitridation. Furthermore, this low energy, direct plasma method provides for not only increased net nitrogen content in the gate dielectric layer, but also increased nitrogen concentration at the gate electrode-gate oxide interface, and reduce nitrogen concentration at the gate oxide-silicon is channel interface.

An advantage of embodiments of the present invention is that leakage currents in thin oxides, e.g., 10 angstroms or less, are reduced.

An advantage of embodiments of the present invention is that dopant outdiffusion from polysilicon gate electrodes into the gate oxide is reduced.

A further advantage of embodiments of the present invention is that silicon channel mobility and transconductance of a FET formed with the gate oxide of the present invention are improved.

A further advantage of embodiments of the present invention is a reduced susceptibility of the gate oxide to charging damage during subsequent processing.

A further advantage of embodiments of the present invention is a reduced susceptibility to undercutting (i.e., overetching) of the gate oxide during the patterning of the subsequently formed FET.

A further advantage of embodiments of the present invention is that the overall thermal budget of a manufacturing process may be reduced since nitridation of the gate oxide by direct ionic bombardment using a low energy plasma is done at a lower temperature than nitridation by a thermal operation.

It will be recognized by those skilled in the art and having the benefit of this disclosure that the present invention is applicable to the formation of both n-channel FETs (NFETs) and p-channel FETs (PFETs).

The present invention may be implemented with various changes and substitutions to the illustrated embodiments. For example, the present invention may be practiced not only with silicon wafers as substrates, but also with other substrates, including but not limited to such substrates as silicon on insulator (SOI).

Although specific embodiments, including specific equipment, parameters, methods and materials have been described, it will be readily understood by those skilled in the art and having the benefit of this disclosure, that various other changes in the details, materials, and arrangements of the materials and steps which have been described and illustrated in order to explain the nature of this invention may be made without departing from the principles and scope of the invention as expressed in the subjoined claims.

What is claimed is:

1. A method of nitridizing an oxide of silicon, comprising: exposing the oxide to a low power direct plasma, the low power direct plasma formed from at least nitrogen, and the low power direct plasma formed by utilizing an RF power at approximately 0.003 W/cm2 to 0.2 W/cm2.

2. The method of claim 1, wherein the low power direct plasma is further formed from nitrogen and a second gas.

3. The method of claim 2, wherein the second gas is characterized in that in plasma form it inhibits the deep placement of nitrogen in the oxide.

4. The method of claim 2, wherein the second gas is helium.

5. The method of claim 2, wherein the second gas has a lower ionization energy than nitrogen.

6. The method of claim 5, wherein the oxide is disposed on a substrate and the method further comprises placing the substrate on a susceptor in a plasma reactor; heating the substrate; flowing nitrogen and the second gas through perforations in a cathode disposed such that it is parallel to the substrate and susceptor.

7. The method of claim 6, further comprising flowing the nitrogen into the plasma reaction chamber at a rate in the range of 1 to 5 liters per minute, and flowing the second gas at a rate in the range of 0 to 5 liters per minute.

8. The method of claim 7, further comprising maintaining a pressure in the plasma reaction chamber in the range of 0.5 to 4 torr.

9. The method of claim 8, further comprising delivering RF power to the cathode at approximately 13.54 MHz.

10. A method of forming a gate dielectric layer on a surface of a substrate, comprising:

growing an oxide of silicon on the surface of the substrate;

disposing the substrate between a heatable susceptor and a cathode of a parallel plate plasma reactor such that the substrate is supported and heated by the susceptor, and adjusting a spacing between the susceptor and cathode such that the spacing is between 0.4 and 1.6 cm;

flowing $N_2$ and a gas having a lower ionization energy than $N_2$;

igniting a plasma; and introducing nitrogen into the oxide by direct ionic bombardment at a low RF power in the range of 0.003 W/cm2 to 0.2 W/cm2.

11. The method of claim 10, further comprising maintaining a pressure in the plasma reactor between 0.5 and 4 torr.

12. The method of claim 10, wherein the substrate is heated to between 250° C. and 500° C.

13. The method of claim 12, wherein the $N_2$ flow rate is between 1 an 5 liters/minute, and the helium flow rate is less than 5 liters/min.

14. A method of making a field effect transistor, comprising:

forming an oxide layer on a substrate;

nitridizing the oxide layer in a low power direct plasma formed from nitrogen and helium utilizing an RF power in the range of 0.003 W/cm2 to 0.2 W/cm2;

forming a gate electrode layer over the nitridized oxide layer;

patterning the gate electrode layer to form a gate electrode having opposing sidewalls; and forming source/drain terminals substantially adjacent the opposing sidewalls of the gate electrode.

15. The method of claim 14, wherein nitridizing the oxide layer further comprises flowing $N_2$ into the plasma reaction chamber at a rate of 1 to 5 liters per minute, and flowing helium into the plasma reaction chamber at a rate of 5 liters per minute or less.

16. The method of claim 14, wherein the substrate is disposed between a susceptor and a cathode, the substrate is supported by the susceptor, and the spacing between the susceptor and cathode is controlled to between 0.4 and 1.6 cm.

17. A method of making a field effect transistor, comprising:

forming an oxide layer on a substrate; wherein the substrate is disposed in a plasma reaction chamber between a susceptor and a cathode, the substrate is supported by the susceptor, and the spacing between the susceptor and cathode is controlled to between 0.4 and 1.6 cm;

nitridizing the oxide layer in a low power direct plasma formed from nitrogen and helium;

forming a gate electrode layer over the nitridized oxide layer;

patterning the gate electrode layer to form a gate electrode having opposing sidewalls; and forming source/drain terminals substantially adjacent the opposing sidewalls of the gate electrode; and wherein nitridizing the oxide layer further comprises flowing $N_2$ into the plasma reaction chamber at a rate of 1 to 5 liters per minute, flowing helium into the plasma reaction chamber at a rate of 5 liters per minute or less; delivering RF power in the range of 0.003 to 0.2 $W/cm^2$ to the cathode, maintaining pressure in the reaction chamber to a range between 0.5 and 4 torr, and maintaining a temperature in the reaction chamber of between 250° C. and 500° C.

18. The method of claim 17, wherein the cathode is perforated and the $N_2$ and helium are delivered to the plasma through the cathode perforations.

19. The method of claim 18, wherein the pressure in the reaction chamber is maintained by operation of a vacuum pump and a throttle valve.

20. A method of making a field effect transistor, comprising:

forming an oxide layer on a substrate, wherein the substrate is disposed between a susceptor and a cathode, the substrate is supported by the susceptor, and the spacing between the susceptor and cathode is controlled to between 0.4 and 1.6 cm, and wherein RF power in the range of 0.003 to 0.2 W/cm2 is delivered to the cathode;

nitridizing the oxide layer in a low power direct plasma formed from nitrogen and helium;

forming a gate electrode layer over the nitridized oxide layer;

patterning the gate electrode layer to form a gate electrode having opposing sidewalls; and forming source/drain terminals substantially adjacent the opposing sidewalls of the gate electrode.

21. The method of claim 20, wherein the nitrogen and helium are in a volumetric ratio between 1:1 and 1:5.

22. The method of claim 20, wherein the RF power is delivered at approximately 13.54 MHz.

23. The method of claim 20, wherein the nitridizing occurs at a reaction pressure between 0.5 and 4 torr.

* * * * *